United States Patent [19]
Masuda

[11] Patent Number: 5,252,973
[45] Date of Patent: Oct. 12, 1993

[54] APPARATUS FOR DIGITAL-TO-ANALOGUE CONVERSION

[75] Inventor: Toshishiko Masuda, Tokyo, Japan

[73] Assignee: Sony Corporation, Tokyo, Japan

[21] Appl. No.: 902,643

[22] Filed: Jun. 23, 1992

[30] Foreign Application Priority Data

Jul. 3, 1991 [JP] Japan .................................. 3-188249

[51] Int. Cl.⁵ ............................................ H03M 1/20
[52] U.S. Cl. ...................................... 341/131; 341/143
[58] Field of Search ......................... 341/131, 143, 144

[56] References Cited

U.S. PATENT DOCUMENTS

| 4,916,449 | 4/1990 | Kubo et al. | 341/131 |
| 4,937,576 | 6/1990 | Yoshio et al. | 341/131 |
| 5,012,242 | 4/1991 | Yoshio et al. | 341/131 |
| 5,073,778 | 12/1991 | Ueki et al. | 341/131 |
| 5,144,308 | 9/1992 | Norsworthy | 341/131 |

OTHER PUBLICATIONS

Principles of Digital Audio, 2nd Edition, Ken C. Pohlmann, Howard W. Sams & Co., 1989, *Quantization Distortion*, pp. 61-70.

Primary Examiner—sharon D. Logna
Attorney, Agent, or Firm—Jerry A. Miller

[57] ABSTRACT

An apparatus for digital-to-analogue conversion. A dither generator creates a noise signal which is added to a digital input signal to produce an added output. Noise shaping is performed on the added output at a noise shaping circuit. The noise shaping circuit includes a quantizer with certain threshold levels for quantizing the added signal. A digital-to-analogue (D/A) converter converts the output of the noise shaping circuit to an analog signal. A control circuit widens the threshold levels as a level of the digital input signal becomes zero, and attenuates an input signal to the digital-to-analogue converter by about 1/K times when the threshold levels are increased by K times.

15 Claims, 4 Drawing Sheets

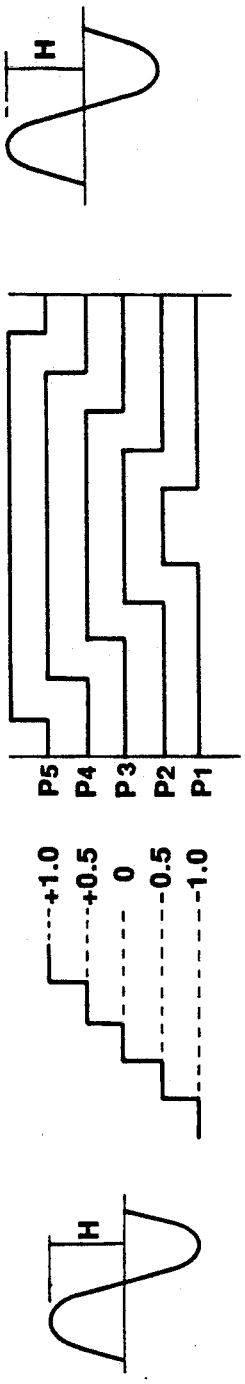

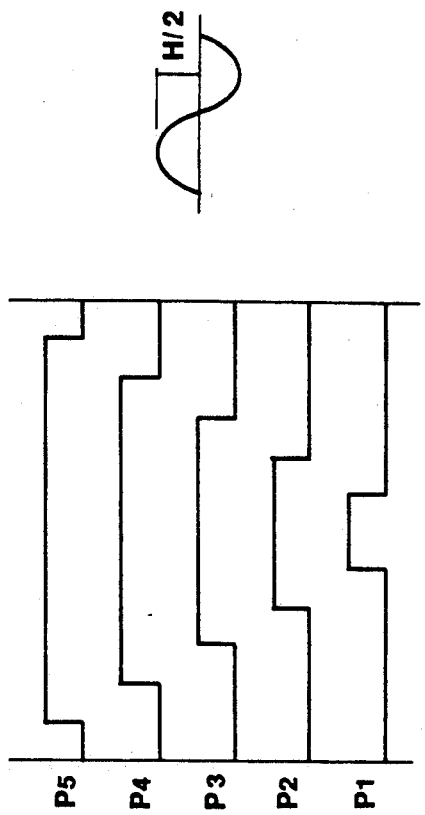
FIG.5(a) AC COMPONENT OF DITHER
FIG.5(b) THRESHOLD OR OUTPUT LEVEL OF QUANTIZER
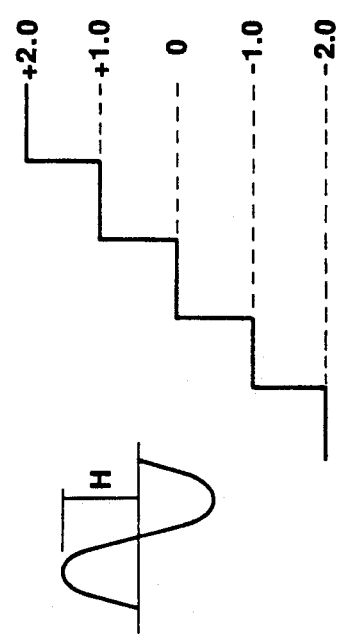
FIG.5(c) OUTPUT PULSE OF ONE BIT D/A CONVERTER
FIG.5(d) ANALOGUE OUTPUT WAVEFORM

APPARATUS FOR DIGITAL-TO-ANALOGUE CONVERSION

BACKGROUND

1. Field of the Invention

The present invention relates generally to an apparatus for digital-to-analogue conversion, which is applicable to, in particular, the output stage of Digital Audio Equipment.

2. Background of the Invention

A system for one-bit digital-to-analogue conversion (D/A conversion) with a Noise Shaping circuit has been developed and widely used in digital audio systems. Referring to FIG. 6, basic construction of the one-bit D/A conversion system will be explained.

In FIG. 6, a digital input signal $D_i$ with $N_0$ bits derived from an input terminal 21 is provided to a digital filter 22. The signal is processed by over-sampling at the filter 22 and becomes data with $N_1$ bits. The $N_1$ bit data is provided to a noise shaping circuit 23 and processed by noise shaping. As a result, the data is compressed to $N_2$ bits (normally, $N_2$ equals one to four bits). By means of this noise shaping, quantization noise in a low frequency band is driven to high frequency band so that the signal-to-noise (S/N) ratio within the audible frequency band can be improved. The $N_2$ bit data is converted into a one bit (binary value) pulse wave at a one bit D/A converter 24. The output of this D/A conversion is provided to a Low Pass Filter 25, and a smooth analogue output signal $A_0$ is retrieved from an output terminal 26.

In such a D/A conversion system with a noise shaping circuit, a dither (artificial noise) signal is added at the input of the noise shaping circuit to avoid generation of a fixed pattern against low level digital input signals. In other words, in FIG. 6, the adder 27 is connected between the digital filter 22 and the noise shaping circuit 23 so that the dither is provided from the dither generator 28 to the adder 27. The dither from the dither generator 28 is added to the output signal of digital filter 22 and then provided to the noise shaping circuit 23. This prevents a fixed pattern from being generated when the digital input signal has extremely low level.

However, in the above mentioned apparatus for D/A conversion, dither is provided into the noise shaping circuit 23 even when the digital input signal $D_i$ is muted and becomes zero. Then, the output of noise shaping circuit 23 doesn't become zero but has the frequency component of dither. The resulting output of the One-Bit D/A converter 24 has the same dither component. Though the waveform of the output pulse output of the One-Bit D/A converter 24 averages to zero after a long time period, the waveform doesn't always become zero. In other words, the D/A converter 24 does not always output a waveform with 50% pulse duty cycle. This creates a problem of increased noise compared with the cases when the duty cycle is fixed to 50%.

To resolve this problem, it has been proposed that the output waveform from the One-Bit D/A converter 24 is fixed so as to have a 50% duty cycle whenever the digital input signal is muted. However, when the waveform of the output pulse is fixed to have a 50% duty cycle, spike noise is generated. Therefore, the previously mentioned problem is not resolved or invites another problem as mentioned above.

SUMMARY OF THE INVENTION

It is, therefore, an object of the present invention to provide an apparatus for digital-to-analogue conversion which resolves the above mentioned problems.

It is another object of the present invention to provide an apparatus for digital-to-analogue conversion which effectively avoids generating noise at transient.

In one aspect of the present invention, an apparatus for digital-to-analogue conversion includes an adder for adding dither from a dither generator with the digital input signal. A noise shaping circuit performs noise shaping to an added output from the adder. The noise shaping circuit includes a quantizer with certain threshold levels. The apparatus further includes a digital-to-analogue converter for performing a digital-to-analogue conversion to an output from the noise shaping circuit. A control circuit makes the threshold levels wider by a factor of K as a level of the digital input signal becomes zero, and simultaneously attenuates the input to the digital-to-analogue converter to substantially 1/K times.

In another aspect of the invention, an apparatus for digital-to-analogue conversion includes a noise shaping circuit with a negative feedback loop. The quantization noise is generated at a quantizer when making the digital input signal requantized. Through a certain transfer function circuit in the negative feedback loop, the quantization noise is provided to an input stage of the quantizer.

In accordance with the present invention, the quantizer is controlled by the control circuit so as to make the quantizing threshold levels and the quantized output value gradually wider. Also, the control circuit attenuates an input to the digital-to-analogue converter by a factor of about 1/K times when the quantizing threshold levels are increased by K times. Therefore, by means of a simple circuit arrangement, it becomes possible to avoid generating spike noise during transient time periods until the waveform of the output pulse from the D/A converter is finally fixed to a pulse duty cycle of 50%.

Assuming that the dither includes a direct current (DC) component and an alternating current (AC) component, the control circuit gradually mutes the DC component as the digital input signal becomes zero, and then gradually attenuates the AC component. Also, the control circuit makes the quantizing threshold levels gradually wider. Attenuation of the AC component may be performed at the stage of adding dither. But, it is preferable to provide an attenuating means at the output stage of the quantizer so that an input to the D/A converter can be controllably attenuated by a factor of 1/K when the quantizing threshold levels are increased by a factor of K. In this case, if $K=2^n$, where n is an integer, the attenuation can be performed by simple bit-shifting. Therefore, the circuit arrangement can be simplified. It is also preferable that the timing for changing over the quantizing threshold levels is adjusted to the point where the AC component of dither becomes zero.

If a One-Bit D/A converter is used as a D/A converter of this invention, and more than a predetermined number of output samples (for example more than four output samples) from the noise shaping circuit consecutively become zero as the quantizing threshold levels become wider and the degree of attenuation becomes large, then the AC component of dither becomes zero.

It is also preferable that the waveform of output pulses from the One-Bit D/A converter is fixed to a 50% duty cycle at the point where both of the above mentioned consecutive output samples and the AC component of dither become zero.

BRIEF DESCRIPTION OF THE DRAWING

The invention will be more readily understood with reference to the accompanying drawing, wherein:

FIGS 4(a)-4(d) illustrate operation of the quantizer in which the quantizing threshold levels are in steady state ($K=1$).

FIGS. 5(a)-5(d) illustrate operation of the quantizer in which the quantizing threshold levels are made wider ($K>1$).

DESCRIPTION OF THE INVENTION

Figure 1:
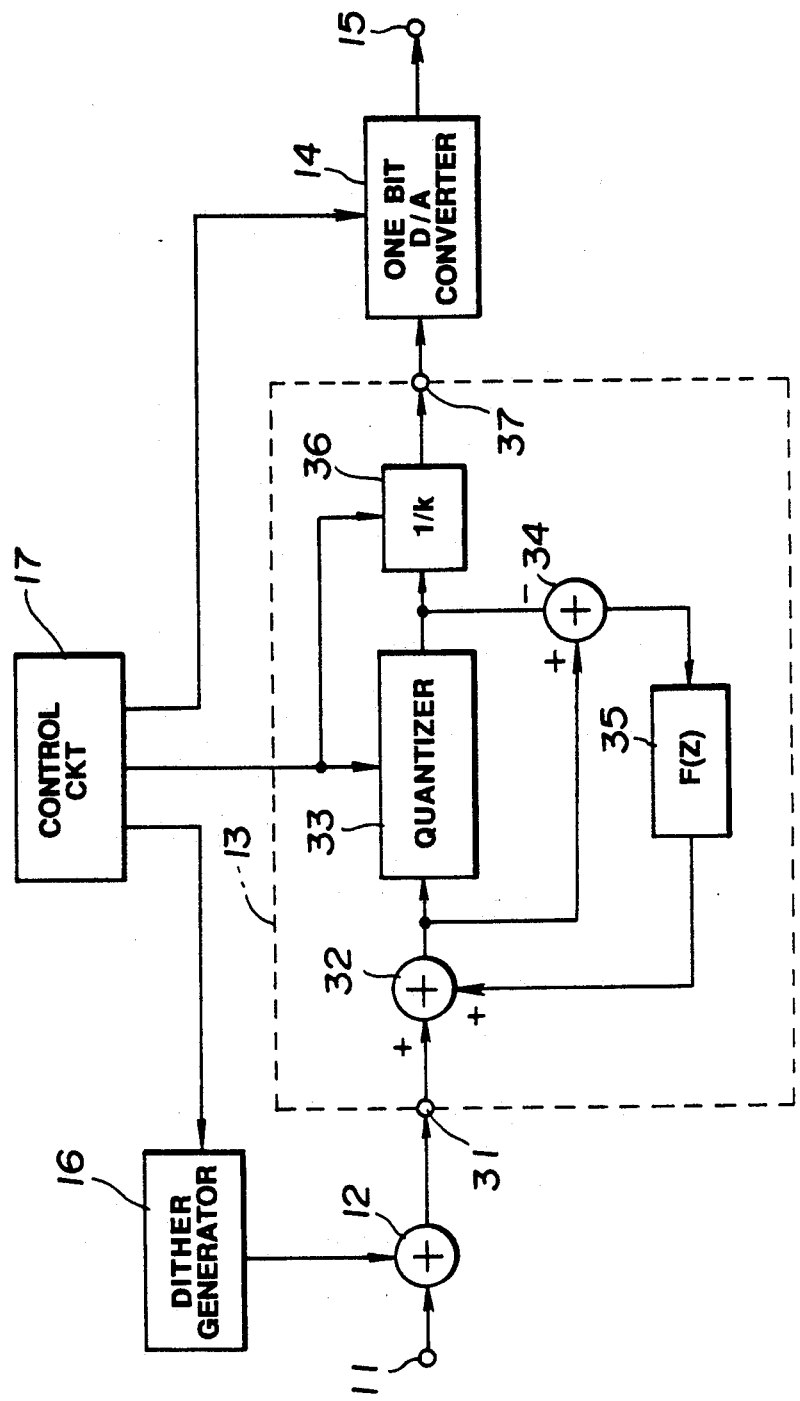
FIG. 1 shows a block diagram of an apparatus for digital-to-analogue conversion as one embodiment of the present invention.
Figure 6:
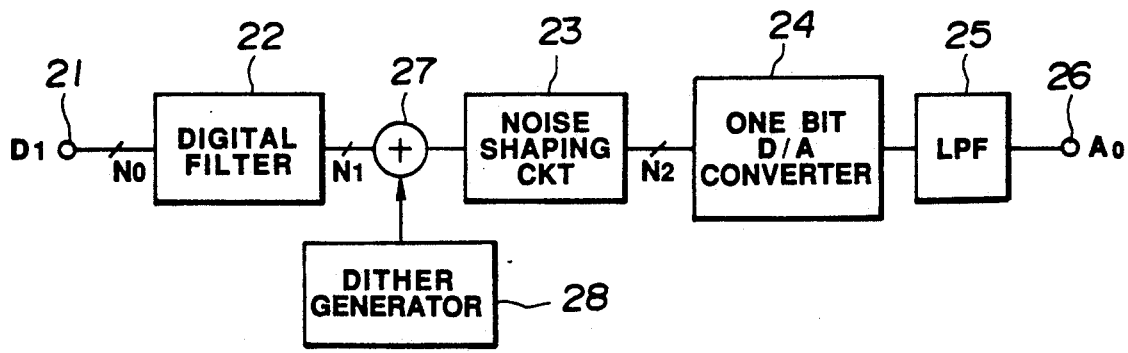
FIG. 6 shows a block diagram of a conventional digital-to-analogue conversion system with a noise shaping circuit and a One-Bit D/A converter.

Referring now to FIG. 1, a block diagram of an apparatus for digital-to-analogue (D/A) conversion is shown as one embodiment of the present invention. A digital signal, derived for example from a digital filter 22 for over-sampling in FIG. 6, is provided to an input terminal 11. This input digital signal is provided to a noise shaping circuit 13 through an adder 12. After the noise shaping process, the output is provided to a One-Bit D/A converter 14. The output of One-Bit D/A converter 14 is retrieved from an output terminal 15 and then provided to an analogue low pass filter (LPF) 25 as previously described in conjunction with FIG. 6. A dither signal generated at a dither generator 16 is added by the adder 12 to the input digital signal. The digital signal with dither is then provided to an input terminal 31 of the noise shaping circuit 13. The noise shaping circuit 13, as will be described later, includes a quantizer 33 whose threshold levels are controlled by a control circuit 17. The noise shaping circuit makes its output $1/K$ times when the quantizing threshold levels are made K times.

When the digital input signal from the input terminal 11 is muted, in other words when the input level becomes zero, the degradation of signal-to-noise ratio (S/N) can be avoided by fixing the pulse duty cycle to 50% for the output from the One-Bit D/A converter 14. However, the pulse duty cycle is gradually changed to 50%, before finally fixing it to 50%, so as to make the output data of the noise shaping circuit 13 converge to zero. Considering a case in which the dither from dither generator 16 comprises a direct current (DC) component and an alternating current (AC) component, the DC component is gradually muted first and then the AC component is gradually attenuated when the digital input signal becomes zero.

One method for muting the DC component is to use a down-counter to down-count one Least Significant Bit (LSB). It can be controlled by the control circuit 17. By this muting of the DC component, spike noise based on the DC component during a transient responding period can be avoided when the pulse waveform has the duty cycle of 50%. Since the DC component is gradually muted, there is no further problem regarding noise during the muting of DC component.

Next, the AC component of dither is muted. So far as the AC component is concerned, it is impossible to have the down-counter perform the muting as with the DC component. This is because positive and negative polarities of data exist in the AC component. A multiplier may be provided for attenuation of AC component at the stage of adding dither. But, this may also increase circuit cost and complexity and increase circuit size when it is integrated into a single chip. Therefore, in accordance with an embodiment of the present invention, the attenuation of the AC component of dither is processed inside the noise shaping circuit 13 when the digital input is muted. Specifically, the control circuit 7 makes the quantizing threshold levels of the quantizer 33 wider by K times and simultaneously attenuates the input of the One-Bit D/A converter 14 $1/K$ times.

Such controlled operation of the noise shaping circuit is explained more in detail below. The digital input signal derived from the input terminal 31 of noise shaping circuit 14 is provided to the quantizer 33 through another adder 32. Corresponding to a control signal from the control circuit 17, the quantizer 33 makes its quantizing threshold levels and its output value K times when the AC component of dither is muted. Another adder 34 subtracts the output of the quantizer from its input to determine quantization error (or noise). The polarity of this error (or noise) signal is converted and represented as $-Qn$. The output of adder 34 is then fed back to the adder 32 (negative feedback) through a circuit 35 with a transfer function $F(z)$. This is known as feedback of quantizing noise or error feedback. By means of this feedback, noise shaping is performed to change the noise spectrum of quantizing output. In other words, noise in the audible frequency band is driven to a higher frequency band by increasing the degree of negative feedback in a lower frequency band. The output of quantizer 33 is attenuated by the attenuator 36 to $1/K$ times the original signal level and then retrieved from the output 37 to be provided to the One-Bit D/A converter 14. If this K is represented by the form $K=2^n$ where (n) is an integer, the attenuator 36 can be easily implemented by a simple bit-shifting circuit 36.

Figure 2:
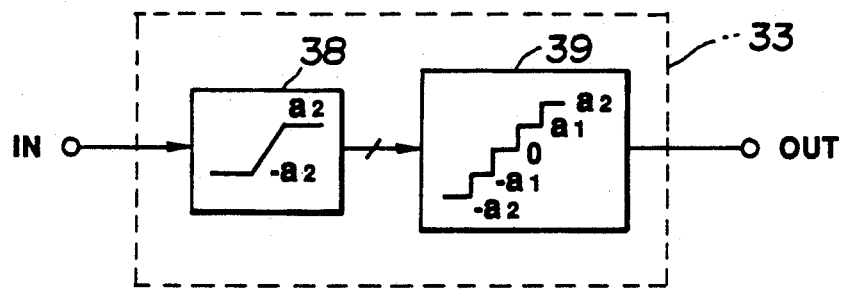
FIG. 2 shows a block diagram of a quantizer of the present invention, in which the quantizing threshold levels are in steady state ($K=1$).
Figure 3:
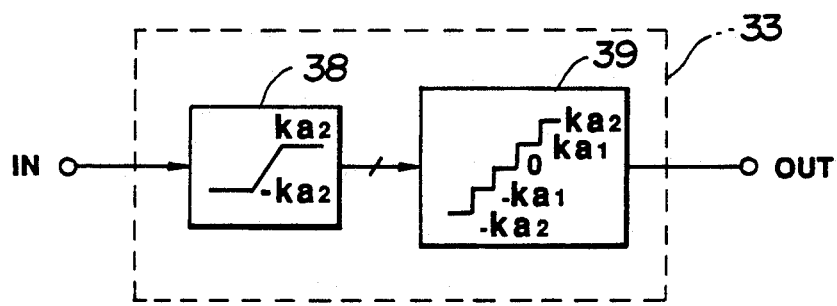
FIG. 3 shows a block diagram of a quantizer of the present invention, in which the quantizing threshold levels are made wider ($K>1$).

Referring now to FIG. 2 and FIG. 3, the process of widening the quantizing threshold levels of quantizer 33 is shown. FIG. 2 and FIG. 3 are more detailed views of quantizer 33 which includes a limiter portion 38 and a quantizer portion 39. FIG. 2 shows the quantizer 33 in steady state ($K=1$) and FIG. 3 shows the quantizer 33 when K is made larger than one ($K>1$).

At steady state ($K=1$) shown in FIG. 2, each of the quantized output values of the quantizer 19 are set to one of five different values (corresponding to approximately 2.3 bits) of $-a1$, $-a2$, $0$, $+a1$, $+a2$ (where $0<a1<a2$). The upper limit value and the lower limit value of the limiter 38 are respectively set to $+a2$ and $-a2$. Therefore, the input signal to quantizer 33 is limited by the limiter 38 between the upper limit value $+a2$ and the lower limit value $-a2$. The limited output is then provided to the quantizer 39 and discriminated by each of the threshold levels. The quantized output is generated with either one of five different output values of $-a1$, $-a2$, $0$, $+a1$ and $+a2$.

On the other hand, as shown in FIG. 3, when the quantizing threshold levels and the output values of the quantizer 33 are adjusted by a factor of K, the quantizer output takes on five different values of −Ka1, −Ka2, 0, +Ka1 and +Ka2. The upper limit and lower limit values of the limiter 18 are also adjusted by a factor of K and respectively become +Ka2 and −Ka2. This means that the limiting range is changed to between −Ka2. The input signal range to the quantizing output levels are still five different values and only the threshold levels are increased by K times.

If the values of K are selected to be powers of two (2) ($K = 2^n$ where the values of n are integer numbers) the quantizer 33 can be realized using bit shifting techniques. When the K values are real numbers other than the powers of two (2), it is preferable for at least the quantizing portion 39 to use a Read Only Memory (ROM) as a look-up table. In this embodiment, input and output values corresponding to each of the K values is stored in the ROM providing a simple circuit implementation. With respect to the attenuator 36 which attenuates the output of quantizer 33 by a factor of 1/K, it is also possible to use a simple bit-shifting circuit when the K values are powers of two (2). For example, when $K = 2$, $1/K = \frac{1}{2}$. Therefore, the attenuator 36 can be a bit-shifting circuit which shifts the output of quantizer 33 down by one bit. When the K values are real numbers, it is preferable to use a ROM similar to that used in the quantizing portion 39.

It is preferable that the quantizing threshold levels are changed at the point where the AC component of dither becomes zero. This is to avoid any noise generated at the transition point where the AC component of dither changes to for example $\frac{1}{2}$, $\frac{1}{4}$ or the like. Therefore, the control circuit 7 sends a control signal to change the threshold levels (K) for the quantizer 33 and the attenuation factor (1/K) of the attenuator 36 at the time when the AC component of dither becomes zero.

In the preferred embodiment, the level of the AC component of dither from the dither generator is approximately −30 Db (about 0.03). By increasing the threshold levels of quantizer 33 by two times, four times and so on, the probability increases that the output data of the noise shaping circuit 13 will be consecutive zeros. In other words, the output data converges to zero. At the same time, the output of One-Bit D/A converter 14 is provided to a Low Pass Filter like the LPF 25 shown in FIG. 6. Therefore, the analogue output also converges to zero.

The output samples (for example more than N output samples) from the noise shaping circuit 13 consecutively become zero as the quantizing threshold levels of the quantizer 33 become wider. Then the AC component of dither becomes zero. The waveform of output pulses from the One-Bit D/A converter 14 is controlled to fix the pulse duty cycle to 50% at the point where both of the consecutive N output samples and the AC component of dither become zero. It is preferable for the above N value to be four (4), though the output is close to zero when N becomes larger.

Referring now to FIG. 4(a), a sine wave with an amplitude (h) is considered as the AC component of dither from the dither generator 16. FIG. 4(b) represents the quantizing threshold levels or the quantizing output values when the quantizer is in steady state (K = 1). The values a1 and a2 used for representing the output values in FIG. 2 respectively correspond to 0.5 and 1. In other words, the output values of quantizer 33 are five values: −1, −0.5, 0, +0.5 and +1. Corresponding to each of the five values of −1, −0.5, 0, +0.5 and +1, the One-Bit D/A converter 14 outputs each pulse of P1, P2, P3, P4 and P5 as shown in FIG. 4(c). Among those pulses, the centered output pulse P3 corresponds to the quantizing output value of zero when it has the pulse duty cycle of 50%. The sine wave signal shown in FIG. 4(a) as the AC component of dither is provided to the quantizer 33 (or the noise shaping circuit 13) and then to the One-Bit D/A converter 14 and the analogue LPF 25. The quantizer 33 and the One-Bit D/A converter 14 respectively have characteristics as shown in FIG. 4(b) and 4(c). Therefore, the analogue output with an amplitude of H as shown in FIG. 4(d) is recovered at the output 15.

FIG. 5, FIG. 5(a) to 5(d) respectively correspond to FIG. 4(a) to 4(d), though the threshold levels of quantizer 33 are doubled (K = 2). Ka1 and Ka2 in FIG. 3 equal one and two (Ka1 = 1, Ka2 = 2). Therefore, the output values from quantizer 33 are −2, −1, 0, +1 and +2. Before providing these values to the One-Bit D/A converter 14, these five values are attenuated by approximately one half ($\frac{1}{2}$). That is K = 2 in the attenuator 36. Therefore, the One-Bit D/A converter 14 generates each of the quantizing outputs of −2, −1, 0, +1 and +2. As a result, the AC component of dither, shown as the sine wave signal in FIG. 5(a), is attenuated to one half. The analogue sine wave output with amplitude H/2 can be obtained as shown in FIG. 5(d).

Considering the AC component of dither as a sine wave signal starts from a value of zero at the first point (address zero) and ending one complete cycle at the eighth point (address seven), the integral over one cycle of the sine wave signal is zero. In other words, the integrated value of the AC dither component becomes zero at the eighth point (address seven) and the AC dither component of analogue output is also considered as being zero. For this reason, the One-Bit D/A converter is controlled by the control circuit 17 so as to fix the output pulse duty cycle to 50% at the point where the AC dither component becomes zero. "The point where the AC dither component becomes zero" means, in a strict sense, "the point where the AC dither component at address zero has zero value".

In accordance with the present embodiment, the worsening signal-to-noise ratio at low signal levels can be avoided by fixing the duty cycle of the output of the One-Bit D/A converter 14 at 50% when input signal level at the input terminal 11 is muted to zero. The embodiment further has the following advantages.

First, by muting the DC component of dither from the dither generator 16, we can avoid generating spike noise as a transient response of the DC component when the pulse duty cycle of the output pulse from the One-Bit D/A converter is fixed to 50%. Further, since this DC component is gradually muted, we can avoid generating any other noise when the DC component is muted.

Furthermore, as the AC component of dither from the dither generator 16 is muted by making the quantizing threshold levels wider, the circuit arrangement for muting the AC component can be made simpler, compared with a circuit arrangement which uses a multiplier. At the same time, the control circuit attenuates the input to the digital-to-analogue converter by 1/K times when the quantizing threshold levels are increased by a factor of K. By selecting this K to have values of powers of two (2), bit shifting can easily perform this K times or 1/K times scaling function. Therefore, it is possible to simplify the circuit arrangement.

While specific embodiments of the invention have been shown and disclosed, it is to be understood that numerous changes and modifications may be made by those skilled in the art without departing from the scope and intent of the invention. For example, instead of arranging the attenuator 36 independently, it may be possible to add the attenuator to the input stage of the One-Bit D/A converter. It may be also possible to make and use dither only with the AC component from the dither generator 16. Further, in the above embodiment, when more than four samples of output data from the noise shaping circuit 13 consecutively become zero, the pulse duty cycle of the output pulse of the D/A conversion is fixed to 50%. However, the number of samples is not limited to four. More or fewer samples could be used. Also, a multibit D/A converter can be used instead of the One-Bit D/A converter 14.

What is claimed is

1. Apparatus for digital-to-analogue conversion comprising:
   a dither generator;
   an adder for adding dither from said dither generator to a digital input signal to produce an added output;
   a noise shaping circuit having an output, for performing noise shaping on said added output;
   said noise shaping circuit including a quantizer with certain threshold levels;
   a digital-to-analogue (D/A) converter converting said output from said noise shaping circuit to an analog signal; and
   control means for widening said threshold levels as a level of said digital input signal becomes zero, and for attenuating an input signal to said digital-to-analogue converter by substantially 1K times when said threshold levels are increased by K times, where K is a number.

2. Apparatus for digital-to-analogue conversion according to claim 1, wherein $K=2^n$ where n is an integer, and wherein said attenuating and widening are performed by bit shifting in said control means.

3. Apparatus for digital-to-analogue conversion according to claim 1, wherein said D/A converter includes a One-Bit digital-to-analogue converter.

4. Apparatus for digital-to-analogue conversion according to claim 1, wherein said control means fixes a pulse duty cycle of an output from said D/A converter to 50% at a point where an AC component of said dither becomes zero and when more than four consecutive samples of output data from said noise shaping circuit equal zero.

5. Apparatus for digital-to-analogue conversion according to claim 1, wherein said control means fixes a pulse duty cycle of an output from said D/A converter to 50% at a point where an AC component of said dither becomes zero.

6. Apparatus for digital-to-analog conversion according to claim 1, wherein said control means fixes an output from said D/A converter to 50% pulse duty cycle when more than four consecutive samples of output data from said noise shaping circuit equal zero.

7. Apparatus for digital-to-analogue conversion according to claim 1, wherein $K=2^n$ where n is an integer.

8. Apparatus for digital-to-analogue conversion according to claim 1, further comprising memory means for storing a lookup table with a plurality of sets of input and output values stored therein for each of a plurality of values of K.

9. Apparatus for digital-to-analogue conversion comprising:
   a dither generator;
   an adder for adding dither from said dither generator to a digital input signal to produce an added output;
   a noise shaping circuit having an output, for performing noise shaping on said added output;
   said noise shaping circuit including a quantizer with certain threshold levels;
   a one bit digital-to-analogue (D/A) converter converting said output from said noise shaping circuit to an analog signal;
   control means for widening said threshold levels as a level of said digital input signal becomes zero, and for attenuating an input signal to said digital-to-analogue converter by substantially 1/K times when said threshold levels are increased by K times where $K=2^n$ with n being an integer, said control means performing said attenuating and said widening by bit shifting; and
   wherein said control means fixes a pulse duty cycle of an output from said D/A converter to 50% at a point where an AC component of said dither becomes zero and when more than four consecutive samples of output data from said noise shaping circuit equal zero.

10. A method for digital-to-analogue conversion comprising the steps of:
    adding a dither signal to a digital input signal to produce an added signal;
    noise shaping said added signal to produce a shaped signal;
    quantizing said shaped signal to certain threshold levels to produce a quantized signal;
    widening said threshold levels by K times, where K is a number, as a level of said digital input signal becomes zero;
    attenuating said quantized signal by approximately 1/K times when said threshold levels are increased by K times to produce an output signal.

11. The method of claim 10, further comprising the step of converting said output signal to an analog signal.

12. The method of claim 11, wherein said converting step is carried out by a one bit digital-to-analog converter.

13. The method of claim 10, wherein $K=2^n$, where n is an integer.

14. The method of claim 13, wherein said widening and attenuating steps are carried out by bit shifting.

15. The method of claim 11, further comprising the steps of fixing a pulse duty cycle of an output from said D/A converter to 50% at a point where an AC component of said dither signal becomes zero and when more than four consecutive samples of said output signal equal zero.

* * * * *